(12) United States Patent
Krusin-Elbaum et al.

(10) Patent No.: US 8,466,444 B2
(45) Date of Patent: Jun. 18, 2013

(54) THREE-TERMINAL CASCADE SWITCH FOR CONTROLLING STATIC POWER CONSUMPTION IN INTEGRATED CIRCUITS

(75) Inventors: Lia Krusin-Elbaum, Dobbs Ferry, NY (US); Dennis M. Newns, Yorktown Heights, NY (US); Matthew R. Wordeman, Kola, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/406,096

(22) Filed: Feb. 27, 2012

(65) Prior Publication Data

US 2012/0153248 A1 Jun. 21, 2012

Related U.S. Application Data

(60) Division of application No. 12/551,643, filed on Sep. 1, 2009, now Pat. No. 8,143,609, which is a division of application No. 12/122,969, filed on May 19, 2008, now Pat. No. 7,652,279, which is a continuation of application No. 11/393,259, filed on Mar. 30, 2006, now Pat. No. 7,646,006.

(51) Int. Cl.
*H01L 47/00* (2006.01)
(52) U.S. Cl.
USPC .................................... 257/2; 257/4; 257/49
(58) Field of Classification Search
USPC ......................................................... 257/2, 4
See application file for complete search history.

(56) References Cited

U.S. PATENT DOCUMENTS

| | | | |
|---|---|---|---|
| 6,087,689 | A | 7/2000 | Reinberg |
| 6,448,576 | B1 | 9/2002 | Davis et al. |
| 6,912,146 | B2 | 6/2005 | Gill et al. |
| 6,970,034 | B1 | 11/2005 | Harris |
| 7,026,639 | B2 | 4/2006 | Cho et al. |
| 7,151,300 | B2 | 12/2006 | Chang |
| 7,196,346 | B2 | 3/2007 | Okuno |
| 7,208,751 | B2 | 4/2007 | Ooishi |
| 7,221,579 | B2 | 5/2007 | Krusin-Elbaum et al. |
| 7,324,365 | B2 | 1/2008 | Gruening-von Schwerin et al. |

(Continued)

OTHER PUBLICATIONS

Aoki et al., "Temperature Dependence of TaSiN Thin Film Resistivity From Room Temperature to 900 Degrees," Jpn. J. Appl. Phys., Jun. 15, 2001, pp. L603-L605, vol. 40, The Japan Society of Applied Physics, Japan.

(Continued)

*Primary Examiner* — Wael Fahmy
*Assistant Examiner* — Sarah Salerno
(74) *Attorney, Agent, or Firm* — Cantor Colburn LLP; Vazken Alexanian

(57) ABSTRACT

A switching circuit includes a plurality of three-terminal PCM switching devices connected between a voltage supply terminal and a sub-block of logic. Each of the switching devices includes a PCM disposed in contact between a first terminal and a second terminal, a heating device disposed in contact between the second terminal and a third terminal, the heating device positioned proximate the PCM, and configured to switch the conductivity of a transformable portion of the PCM between a lower resistance state and a higher resistance state; and an insulating layer configured to electrically isolate the heater from said PCM material, and the heater from the first terminal. The third terminal of a first of the PCM switching devices is coupled to a set/reset switch, and the third terminal of the remaining PCM switching devices is coupled to the second terminal of an adjacent PCM switching device in a cascade configuration.

6 Claims, 10 Drawing Sheets

U.S. PATENT DOCUMENTS

| | | | |
|---|---|---|---|
| 7,388,273 | B2 | 6/2008 | Burr et al. |
| 7,391,642 | B2 | 6/2008 | Gordon et al. |
| 7,394,089 | B2 | 7/2008 | Doyle et al. |
| 7,411,818 | B1 | 8/2008 | Elmegreen et al. |
| 7,453,081 | B2 | 11/2008 | Happ et al. |
| 7,473,921 | B2 | 1/2009 | Lam et al. |
| 7,646,006 | B2 | 1/2010 | Krusin-Elbaum et al. |
| 7,652,279 | B2 | 1/2010 | Krusin-Elbaum et al. |
| 2003/0073295 | A1 | 4/2003 | Xu |
| 2003/0116794 | A1 | 6/2003 | Lowrey |
| 2004/0012009 | A1 | 1/2004 | Casagrande et al. |
| 2004/0203183 | A1 | 10/2004 | Cho et al. |
| 2005/0029503 | A1 | 2/2005 | Johnson |
| 2005/0029505 | A1 | 2/2005 | Lowrey |
| 2005/0064606 | A1 | 3/2005 | Pellizzer et al. |
| 2005/0121789 | A1 | 6/2005 | Madurawe |
| 2005/0158950 | A1 | 7/2005 | Scheuerlein et al. |
| 2005/0188230 | A1 | 8/2005 | Bilak |
| 2006/0017076 | A1 | 1/2006 | Lankhorst et al. |
| 2006/0091374 | A1 | 5/2006 | Yoon et al. |
| 2006/0092694 | A1 | 5/2006 | Choi et al. |
| 2006/0158928 | A1 | 7/2006 | Pellizzer et al. |
| 2007/0096071 | A1 | 5/2007 | Kordus, II et al. |
| 2007/0099405 | A1 | 5/2007 | Olivia et al. |
| 2007/0148855 | A1* | 6/2007 | Chen et al. .................... 438/238 |
| 2008/0012094 | A1 | 1/2008 | Ma et al. |
| 2008/0044632 | A1 | 2/2008 | Liu et al. |
| 2008/0048168 | A1* | 2/2008 | Sato ................................ 257/3 |
| 2008/0048169 | A1 | 2/2008 | Doyle et al. |
| 2008/0061282 | A1* | 3/2008 | Sato et al. ......................... 257/4 |
| 2008/0067486 | A1* | 3/2008 | Karpov et al. .................... 257/3 |
| 2008/0158942 | A1 | 7/2008 | Nirschl et al. |
| 2008/0210925 | A1 | 9/2008 | Krusin-Elbaum et al. |
| 2009/0033358 | A1 | 2/2009 | Chen et al. |
| 2009/0033360 | A1 | 2/2009 | Chen et al. |
| 2009/0154806 | A1 | 6/2009 | Chang et al. |
| 2009/0321710 | A1 | 12/2009 | Krusin-Elbaum et al. |

OTHER PUBLICATIONS

C.A. Angell, "Formation of Glasses From Liquids and Biopolymers," Science, Mar. 31, 1995, pp. 1924-1934, vol. 267.

C.J. Glassbreenner et al., "Thermal Conductivity of Silicon and Geranium From 3 K to the Melting Point*," Physical Review, May 18, 1964, pp. A1058-A1069, vol. 134, No. 4A.

C.J. Tymczak and John R. Ray, "Asymmetric Crystallization and Melting Kinetics In Sodium: A Molecular-Dynamics Study," Physical Review Letters, Mar. 12, 1990, pp. 1278-1281, vol. 64, No. 11, The American Physical Society.

Lu Cheng et al., "Experimental and Theoretical Investigations of Laser-Induced Crystallization and Amoerphization in Phase-Change Optical Recording Media," Journal of Applied Physics, Nov. 1, 1997, pp. 4183-4191, vol. 82, No. 9, American Institute of Physics.

Erwin R. Meinders and Martjin H. R. Lankhorst, "Determination of the Crystallization Kinetics of Fast-Growth Phase-Change Materials for Mark-Formation Prediction," Jpn. J. Appl. Phys., Feb. 2003, pp. 809-812, vol. 42, No. 2B, The Japan Society of Applied Physics.

"Exploring Potential Benefits of 3D FPGA Integration," pp. 1-6, Nov. 1997.

L. Van Pieterson, M.H.R. Lankhorst, M. Van Schijndel, A.E. Kuiper and J.H.J. Roosen, "Phase-Change Recording Materials With a Growth-Dominated Crystallization Mechanism: A Materials Overview," Journal of Applied Physics, 2005, pp. 1-7, American Institute of Physics.

J. Maimon et al; "Chalcogenide-Based Non-Volatile Memory Technology;" IEEE; 2001 pp. 5-2289-5-2294.

U.S. Appl. No. 12/551,643; Notice of Allowance; Date Filed: Sep. 1, 2009; Date Mailed: Oct. 18, 2011.

U.S. Appl. No. 12/551,631; Non-Final Office Action; Date Filed: Sep. 1, 2009; Date Mailed: Oct. 14, 2011.

S. Lai et al; "OUM—A 180 nm Nonvaltile Memory Cell Element Technology for Stand Alone and Embedded Applications;" IEEE, 2001, pp. 36.5.1-36.5.4.

S. Tyson et al., "Nonvolitile, High Density, High Performance Phase-Change Memory," IEEE, 2000, pp. 385-390.

Volkert et al., "Modeling of Laser Pulsed Heating and Quenching In Optical Data Storage Media," Journal of Applied Physics, Aug. 15, 1999, pp. 1808-1816, vol. 86, No. 4, American Institute of Physics.

XESS.com, [online]; [retrieved on Jul. 20, 2005]; retrieved from the Internet file://C:\DOCUME~\ADMINI~1\LOCALS~1\Temp\V9K43UPW.htm XESS Corp., "What Are CPLDs And FPGAs?," Jul. 20, 2005, pp. 1-3; Webmaster@xess.com.

Young-Tae Kim et al., "Study on Cell Characteristics of PRAM Using The Phase-Change Simulation," IEEE, 2003, pp. 211-214.

* cited by examiner

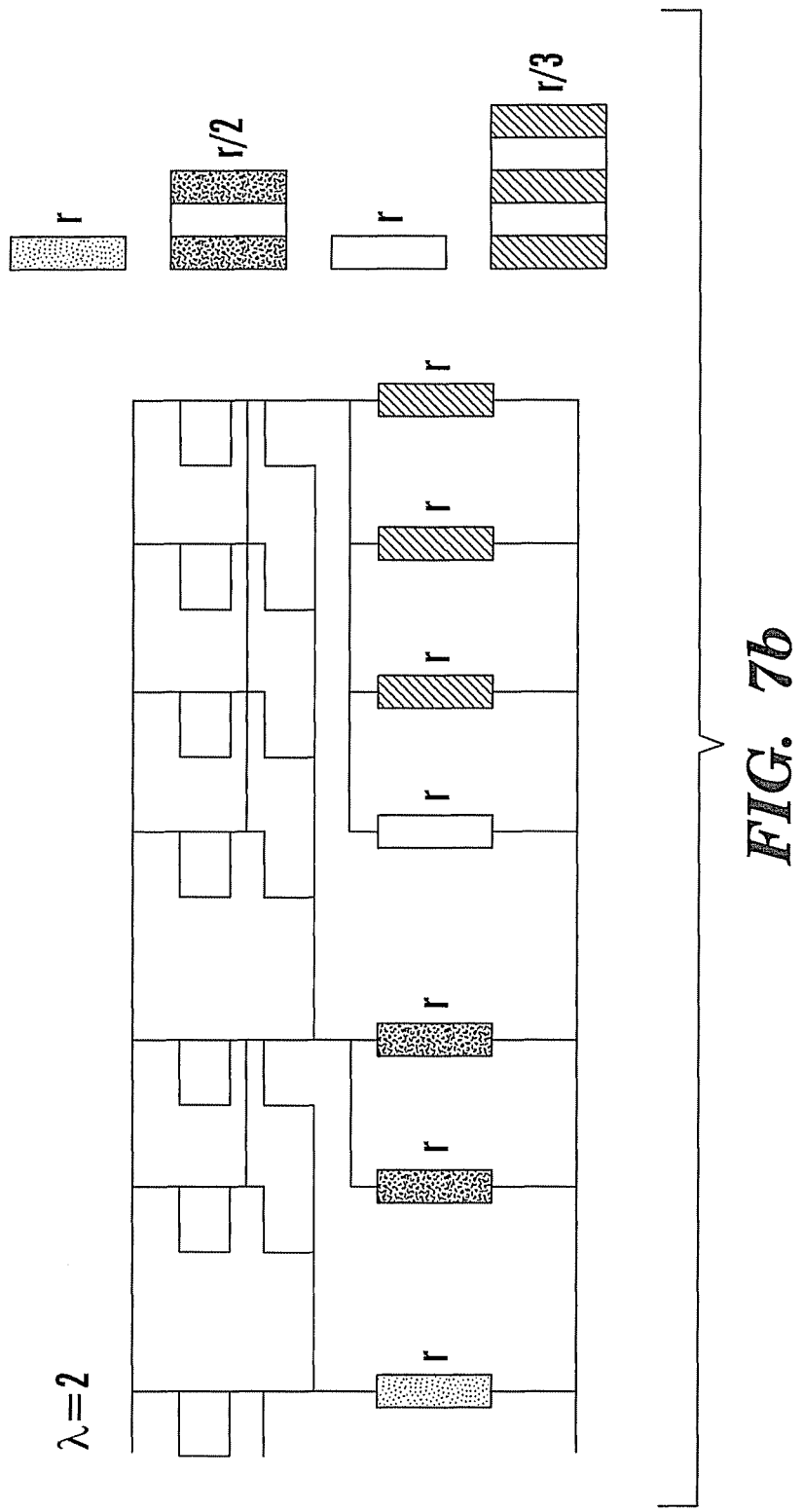

THREE-TERMINAL CASCADE SWITCH FOR CONTROLLING STATIC POWER CONSUMPTION IN INTEGRATED CIRCUITS

CROSS-REFERENCE TO RELATED APPLICATIONS

This application is a divisional application of U.S. patent application Ser. No. 12/551,643, filed Sep. 1, 2009, which is a divisional application of U.S. patent application Ser. No. 12/122,969, filed May 19, 2008 (now U.S. Pat. No. 7,652,279), which is a continuation of U.S. patent application Ser. No. 11/393,259, filed Mar. 30, 2006 (now U.S. Pat. No. 7,646,006), the disclosures of which are incorporated by reference herein in its entirety.

BACKGROUND

The present invention relates generally to controlling power consumption in integrated circuit devices and, more particularly, to a three-terminal cascade switch for controlling static power consumption in integrated circuits.

Power consumption and heat generation in complementary metal oxide semiconductor (CMOS) integrated circuits is made up of a dynamic (or active) component and a static (or standby) component. Dynamic heat generation arises primarily from the charging and discharging of load capacitances during device switching, and is proportional to the system operating frequency. Presently, this component of power consumption is typically controlled by turning off the clock input signal to unused logic blocks.

On the other hand, static heat generation results from direct current (DC) flow through gates and other sources of current leakage, and is independent of operating frequency. In most digital logic circuits, dynamic power consumption is the dominant component while the chip is active. However, when the clock is stopped and a CMOS device enters a "sleep" mode to conserve power, static power consumption becomes the dominant component.

Because modern circuits are being designed with smaller and smaller gate thicknesses to improve performance, the resulting effect has been to boost the static power consumption component exponentially. FIG. 1 is a graph that illustrates the projected relative magnitudes of power consumption of the dynamic and static components as a function of decreasing feature size over time. As can be seen, the static heat component is increasing exponentially fast with respect to the dynamic source with decreasing feature size, and is expected to equal the dynamic heat production at a feature size of approximately 44 nanometers. Thus, unless a solution to the gate leakage problem is found, control of static heat sources in integrated circuits will become as essential as the control of dynamic power currently practiced.

Presently, static heat sources may be controlled by turning off the supply voltage to unused logic blocks (also referred to as "power gating"). Power gating is conventionally implemented by inserting a power level FET in the supply circuit of each isolatable logic block to enable control of its power supply. Unfortunately this approach occupies significant chip real estate due to the area of the power level FET, thereby incurring an area penalty for eliminating the static power dissipation.

Accordingly, it would therefore be desirable to be able to address the issue of stating power dissipation in a manner that overcomes the area penalty associated with conventional static power control means.

SUMMARY

The foregoing discussed drawbacks and deficiencies of the prior art are overcome or alleviated by a three-terminal switching device for use in integrated circuit devices. In an exemplary embodiment, the device includes a phase change material (PCM) disposed in contact between a first terminal and a second terminal, a heating device disposed in contact between the second terminal and a third terminal, the heating device positioned proximate the PCM, and configured to switch the conductivity of a transformable portion of the PCM between a lower resistance crystalline state and a higher resistance amorphous state. An insulating layer is configured to electrically isolate the heater from said PCM material, and the heater from said first terminal.

In another embodiment, a switching circuit configured for controlling static power consumption in integrated circuits includes a plurality of three-terminal, phase change material (PCM) switching devices connected between a voltage supply terminal and a corresponding sub-block of integrated circuit logic. Each of the PCM switching devices further includes a phase change material (PCM) disposed in contact between a first terminal and a second terminal, a heating device disposed in contact between the second terminal and a third terminal, the heating device positioned proximate the PCM, and configured to switch the conductivity of a transformable portion of the PCM between a lower resistance crystalline state and a higher resistance amorphous state; and an insulating layer configured to electrically isolate the heater from said PCM material, and the heater from the first terminal. The third terminal of a first of the PCM switching devices is coupled to a set/reset switch, and the third terminal of the remaining PCM switching devices is coupled to the second terminal of an adjacent PCM switching device in a cascade configuration.

BRIEF DESCRIPTION OF THE DRAWINGS

Referring to the exemplary drawings wherein like elements are numbered alike in the several Figures:

FIGS. 7($a$) and 7($b$) schematically illustrate cascades of identical and non-identical stages, in which the stages are self-similar.

DETAILED DESCRIPTION

Disclosed herein is a programmable via structure suitable for cascaded use in power gating. Briefly stated, a phase change material (PCM) is incorporated into a plurality of programmable via structure wherein the conductivity of the via is altered by a thermal SET or RESET process that changes the crystal properties of the PCM, and therefore the conductivity of the same. Thus, through a PCM power gating switch, a controlling heater current is used to switch a transformable portion of the PCM material between low (amorphous) and a high (crystalline) electrical conductivity state through the use of a programmed heater current. However, since an individual PCM switch has little if any current gain, the associated FET required to drive the heater component of the device would hardly (if at all) be any smaller than a conventional FET used to switch the power supply directly.

Accordingly, a circuit-level scheme is further disclosed so as to provide the required gain. More specifically, a plurality of PCM switches are cascaded, such that only the first PCM switch in the cascade requires drive current from an FET. As such, the gain is on the order of the number of PCM switches used in the cascade.

Figure 2:
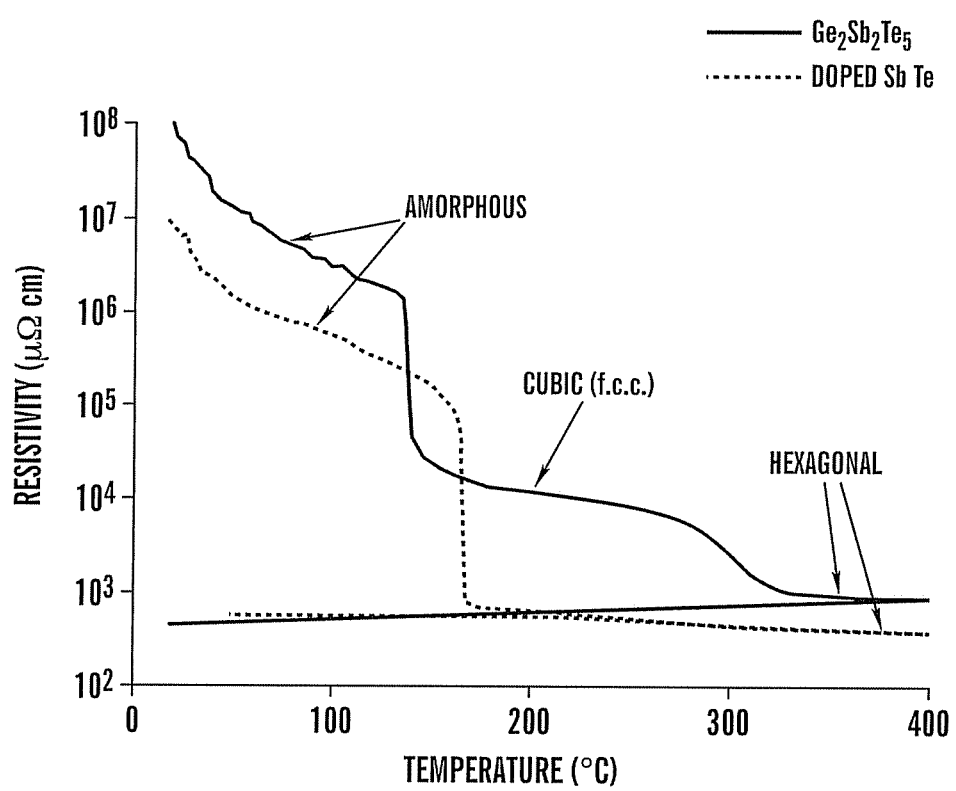
FIG. 2 is a graph illustrating temperature-controlled transitions of phase change materials between amorphous and crystalline (cubic and hexagonal) phases, and the resistivities associated therewith.
Figure 3:
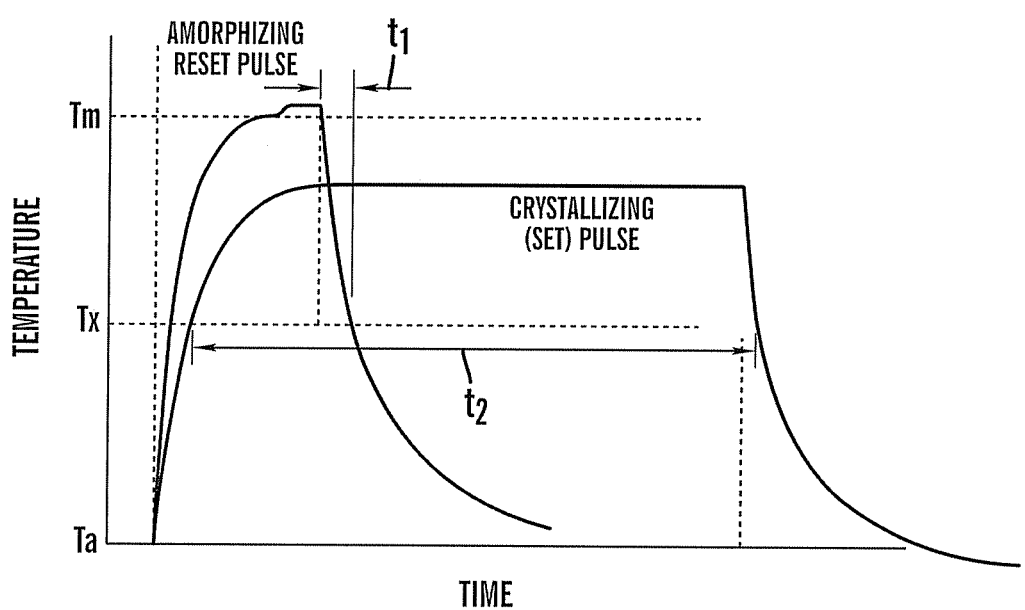
FIG. 3 is a graph illustrating exemplary thermal cycling operations of a phase change material used in a programmable switch, in accordance with an embodiment of the invention.

Phase change materials undergo temperature-controlled transitions between amorphous and crystalline (cubic and hexagonal) phases. These phases have significantly different resistivities associated therewith, as shown in FIG. 2. The amorphous phase may be converted into the crystalline phase by a relatively slow anneal (SET process) at a moderate temperature, as shown in the graph of FIG. 3. Conversely, the crystalline phase may be converted into the amorphous phase (RESET process) by raising the transformable portion of the PCM to the melt temperature, followed by a fast quench on a nanosecond time scale, as also shown in FIG. 3. As a result of the rapid quench, the disordered arrangement of atoms of the PCM due to the melt is retained.

Figure 4A:
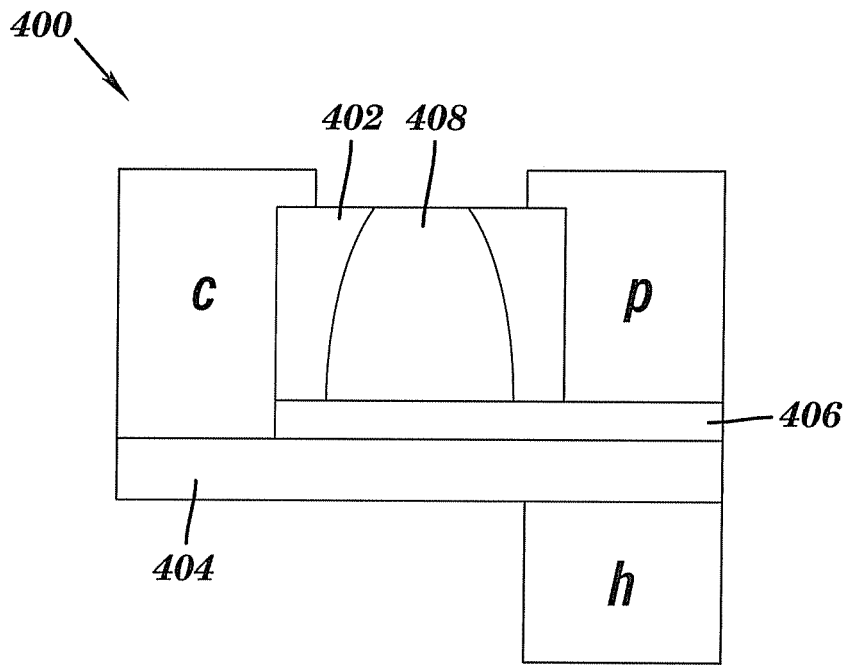
FIGS. 4($a$) and 4($b$) illustrate a three-terminal PCM switch, suitable for use in accordance with an embodiment of the invention.
Figure 4B:
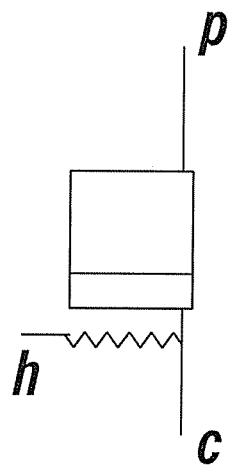

Referring now to FIGS. 4(a) and 4(b), a three-terminal PCM switch 400, suitable for use in accordance with an embodiment of the invention, is illustrated. As is shown, the PCM switch 400 includes a heater terminal h, a PCM terminal p, and a common terminal c. A PCM structure 402 (e.g., PCM filled via) is disposed in contact between the PCM terminal p and the common terminal c. A heater 404 is disposed in electrical contact between the common terminal c and the heater terminal h. In addition, a thin insulating layer 406 electrically isolates the heater 404 from the PCM terminal p and the PCM structure 402. As particularly shown in FIG. 4(a), a transformable portion 408 of the PCM structure 402 is capable of being switched between amorphous and crystalline states, through suitable program current passed through the heater 404.

When the transformable portion 408 of the PCM structure 402 is in the amorphous state, then the PCM switch 400 is considered in an "off" or non conducting state, and thus very little current flows through path p-c. On the other hand, if the PCM structure 402 is fully crystalline, then the PCM switch 400 is considered in an "on" or conducting state, and this current may flow through path p-c. The PCM switch is schematically depicted in FIG. 4(b). Again, at room temperature (and up to moderately elevated temperatures), the PCM material is stable in both the conductive crystalline phase and the insulating amorphous phase.

Figure 1:
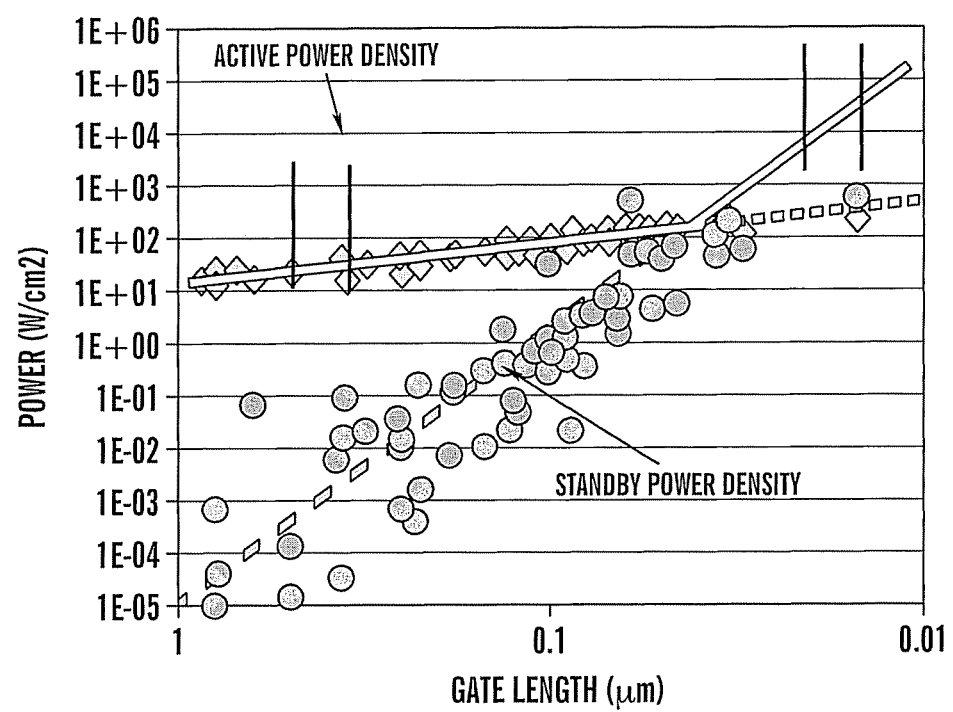
FIG. 1 is a graph that illustrates the projected relative magnitudes of power consumption of the dynamic and static components as a function of decreasing feature size over time.
Figure 5:
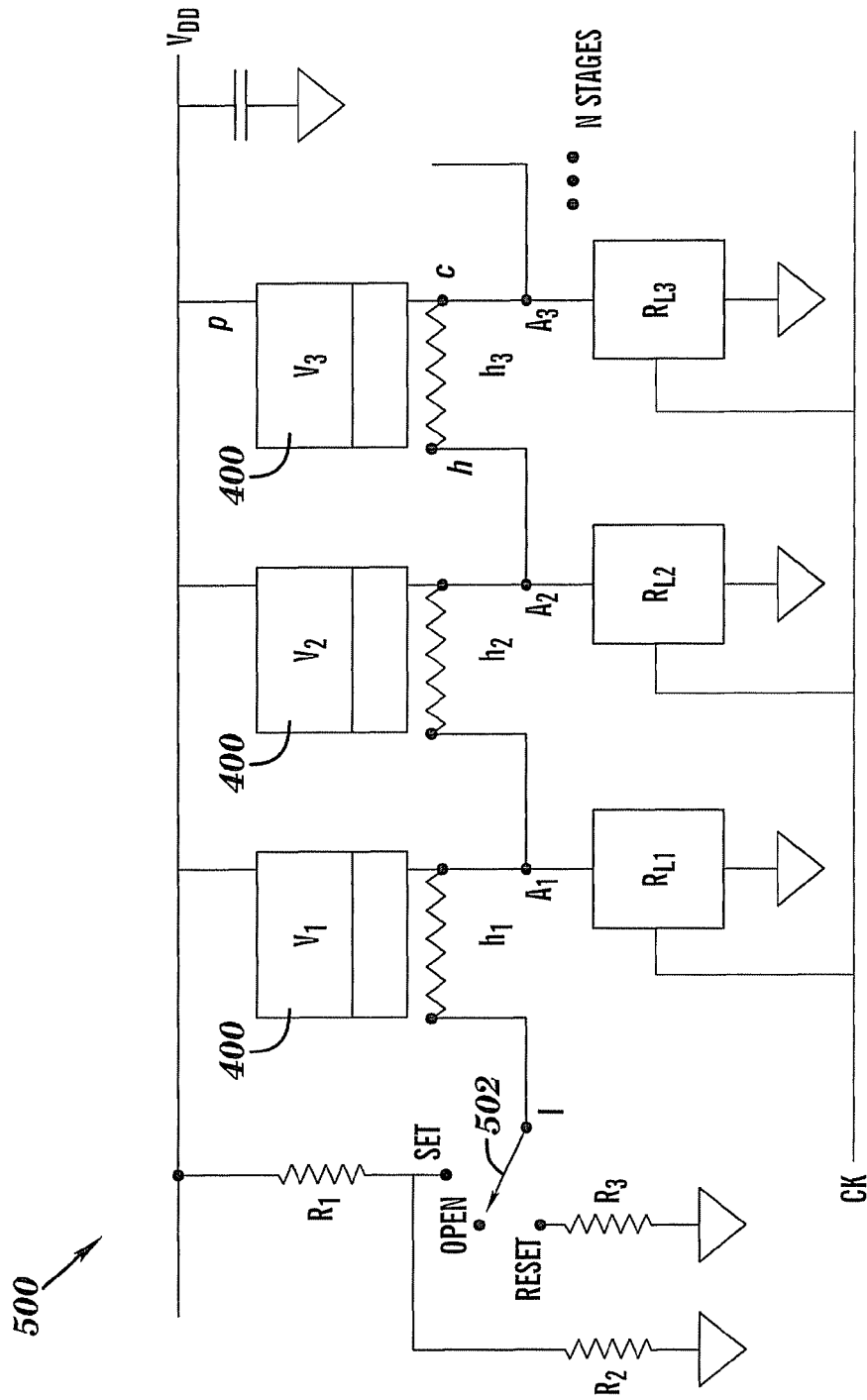
FIG. 5 is a schematic diagram of a PCM control circuit incorporating a plurality of cascaded PCM switches, in accordance with a further embodiment of the invention.

As stated previously, the size of the drive transistor capable of driving the heater terminal of a single PCM switch that isolates unused circuitry is on the order of conventional power FETs used to control the power supply directly. Accordingly, FIG. 5 is a schematic diagram of a PCM control circuit 500 incorporating a plurality of cascaded PCM switches 400 as described above, in accordance with a further embodiment of the invention. Because the individual PCM switches (labeled $V_1, V_2, V_3, \ldots$, etc. in FIG. 5) have only a small footprint, the total device footprint is dominated by the drive switch 502, which may be made relatively small since it only directly drives the first PCM switch. Thus, the total area occupied by the control circuit 500 is significantly lower than in the conventional approach using a single power FET, making the penalty for power gating relatively low. This will enable wider use of power gating, which is even more highly desirable as the era of significant static (standby) current is entered (FIG. 1).

In the embodiment of FIG. 5, the control circuit 500 includes N stages, each having an associated phase change switch 400, the electrical conductivity of which is in turn controlled by corresponding resistive heaters $h_1, h_2, h_3, \ldots$, etc. thermally coupled to the PCM material. Although the figures depict the heater as being located adjacent the bottom of the PCM structures 402, other configurations are also possible. Each PCM stage drives a corresponding sub-block $R_{L1}, R_{L2}, R_{L3}, \ldots$, etc. of the entire logic block as its load. In other words, the entire logic block being power-gated is divided up into N (roughly) equal sub-blocks, with each sub-block becoming the load for a corresponding one the N PCM switches. Thus, each switch 400 has a common connection (p) to the supply voltage $V_{DD}$.

Through the use of a cascaded configuration, only the first heater $h_1$ is directly externally driven through the drive switch 502, as shown at node "I" in FIG. 5. Control of the remaining PCM switches is achieved through a programmed clocking sequence, where the switches and sub-block loads are connected in a cascade fashion. Since clocking of the logic the load sub-block is already controlled in a dynamic mode of circuit operation, no additional transistors are involved for the present static power control circuit.

A simplified description of the operation of the cascade switch is provided below as follows, with a more quantitative analysis provided hereinafter. For purposes of simplicity, it is assumed that each PCM switch 400 forms a perfect switch (i.e., zero "on" resistance, infinite "off" resistance), and that the load resistance is much less than the heater resistance. Initially, it is further assumed that the logic blocks are in a fully OFF state, each PCM switch is in an OFF state, the nodes $A_1, A_2, A_3, \ldots$, etc. are at ground, and the clock signal (CK) is off.

In order to turn power to the logic blocks on (SET process), the clock signal to each sub-block is turned ON. The external switch 502 is activated so as to couple node I to the "Set" position to supply voltage level $V_{DD}$ (through $R_1$, which is a low impedance resistor with respect to $R_2$). Essentially, the entire voltage $V_{DD}$ now appears across heater $h_1$ (since node $A_1$ is initially grounded), which causes crystallization of the transformable portion of the amorphous layer in switch $V_1$. As a result, $V_1$ starts to turn on as it is rendered conductive by the change in the PCM material to complete crystallization. The voltage at node $A_1$ then rises up to $V_{DD}$, thereby causing the current through heater $h_1$ to shut off. Consequently, PCM switch $V_1$ now allows power to be drawn by sub-block $R_{L1}$.

Furthermore, since voltage $V_{DD}$ now appears across heater $h_2$ (node $A_2$ still initially grounded), crystallizing current is passed through $h_2$, and the cycle repeats. That is, $V_2$ starts to turn on as it is rendered conductive by the change in the PCM material. A cascade effect therefore ripples down the chain, with some intrinsic time constant $T_{SET}$ per stage (determined by the rate of heat flow and the melt rate), after which the entire set of switches is turned on and all loads are connected to $V_{DD}$.

Conversely, it is now assumed that the circuit is in the fully ON state, wherein each PCM switch is in the crystalline, conductive state, nodes $A_1, A_2, A_3, \ldots$, etc. are all at $V_{DD}$, and the clock signal CK applied to each sub-block is active. In order to begin shutting power off to the logic blocks, input node I is initially switched to the "Reset" position, which provides a path to ground through $R_3$. Because node $A_1$ is at $V_{DD}$, current now passes through heater $h_1$ (in addition to the logic circuit current already flowing through $V_1$), causing the lower portion of the PCM of $V_1$ to melt. Then, node I is decoupled from the "Reset" position and CK is turned off, thereby shutting the current through $h_1$ off and allowing $V_1$ to rapidly cool, thus quenching the melted region and forming the amorphous state. Switch $V_1$ has at this point been turned off.

Next, node I is once again switched to the "Reset" position and CK is turned on so as provide a low impedance discharge path to ground for node $A_1$ (which is no longer coupled to $V_{DD}$ due to the opening of $V_1$). The potential difference between $A_1$ and $A_2$ thus results in a current through $h_2$. As was the case for $V_1$, the combination of current through heater $h_2$ along with circuit load current through $V_2$ causes a lower layer of the V2 PCM to melt. Then, a subsequent quench is initiated by timely turn off of the clock input signal CK, in combination with decoupling switch 502 from the "Reset" position to the "open" position. After quenching and opening of $V_2$, the clock input CK is once again activated and switch 502 is again placed in the "Reset" position. This process continues until each PCM switch in the cascade is changed to the amorphous state, at which time the clock CK is shut off and the power supply to all logic sub-blocks is off.

Table I below illustrates various properties for a switch formed through filling of a via with a high electrical conductivity PCM (e.g., $GeSb_4$), and suitable for a power gating application in accordance with an embodiment of the invention:

TABLE I

Via Properties

| Quantity | Value |
|---|---|
| Via dimensions | .1 × .1 × .1 μm |
| material | $GeSb_4$ |
| $\rho_c$ | $5 \times 10^{-4}$ (Ωcm) |
| $\rho_a$ | 1 (Ωcm) |
| $R_{on}$ | 50 Ω |
| $R_{off}$ | 100 KΩ |
| $\kappa_a$ | 0.003 (J/(K · cm · sec))* |
| $\kappa_c$ | 0.02 (J/(K · cm · sec))** |
| $\Delta T_{on}$ | 55° C. |
| $\Delta T_{off}$ | 40° C. |

*based on $Ge_2Sb_2Te_5$ material
**based on Wiedemann-Franz law

Assuming that the via material forms a cube, the electrical resistances in the ON and OFF states are easily estimated from the resistivities. The thermal resistances are estimated assuming planar diffusion from the center of the cube to its face, and dividing by 12 for the number of faces. Hence, the temperature rise under equilibrium diffusion is obtained.

The ON current per switch for a single logic sub-block is assumed to be 1 mA. If a larger current is drawn by the sub-block, then more than one switch can be connected in parallel to increase the current while retaining 1 mA per via. With this assumption, and using the values from Table I, the voltage drop due to the switch is about 0.05 V. The OFF current is 10 μA, which is about 1% of the ON current and should represent a significant power savings.

As the switches are heat sensitive, those in the OFF (amorphous) state are potentially susceptible to recrystallization. The temperature rise of 55° C. should be low enough to prevent recrystallization in seconds or minutes. It is relatively straightforward to provide for frequent reprogramming of the power gates so long as the lifetime of the OFF state is not extremely short (e.g., less than 1 second). There may be also a temperature rise in the ON state; however, the quoted temperature rise (Table I) is below the point where this would constitute a problem associated with the temperature coefficient of resistance.

In order obtain rough estimates of the power required for programming the switch, earlier studies have shown that (ignoring lead losses) the heater requires on the order of about 0.73 mW for a RESET operation, and a somewhat lower power level for a SET operation. Such an estimate may be appropriate for the case where there is very little heat loss in the leads. However, this estimate should only to be taken as order of magnitude in the absence accurate 3D simulations.

FIG. 6(*a*) is a schematic model illustrating the cascade configuration of FIG. 5, wherein R=heater resistance, r=load resistance, $\rho_V$=via ON resistance. During a SET operation, it is assumed that all vias (switches) to the left of the point P are OFF, while the vias to the right of point P are ON. The circuit is broken at point P and Thevenin's theorem is applied. The left part of the system forms a battery (source) with an open circuit voltage $V_0$, and an internal impedance $Z_S$. The open circuit voltage is obtained from the potential divider formed by the via impedance $\rho_V$ and the load resistance r across $V_{DD}$:

$$V_0 = \frac{r}{r + \rho_V} V_{DD}.$$

The source impedance of the leftmost cascade (terminated so as to represent an infinite cascade) is given by the equation defined by FIG. 6(*b*):

$$Z_S = -\frac{R}{2} + \frac{1}{2}\sqrt{R^2 + 4R\rho},$$

where $$\rho = r\rho_V/(r+\rho_V)$$

is formed by the via and load impedances in parallel (FIG. 6(*c*)).

The load impedance $Z_L$ is given by the equation defined by FIG. 6(*d*):

$$Z_L = \frac{R}{2} + \frac{1}{2}\sqrt{R^2 + 4Rr}.$$

Finally, the current is obtained from FIG. 6(*e*):

$$I = \frac{V_0}{Z_S + Z_L},$$

and hence the power $W=I^2R$ in the heater is obtained.

In the r→∞ limit (r much larger than R or $\rho_V$) the intuitively simple result is obtained:

$$W \to \frac{V_0^2}{r}$$

In other words, the power in the heater under cascade conditions is equal to the power delivered to the load under operating conditions. The ratio (operating power in via)/W can then be written in this approximation as $\rho_V/r$, which must be small $$\rho_V/r \ll 1$$

for the via to be stable under operating conditions, while changing phase under switching conditions.

With the values $V_0=1V$, $r=1$ K$\Omega$, $R=100\Omega$, and $\rho_V=50\Omega$, a value $W=0.61$ mW is obtained, which a reasonable value for the SET power.

Figure 6A:
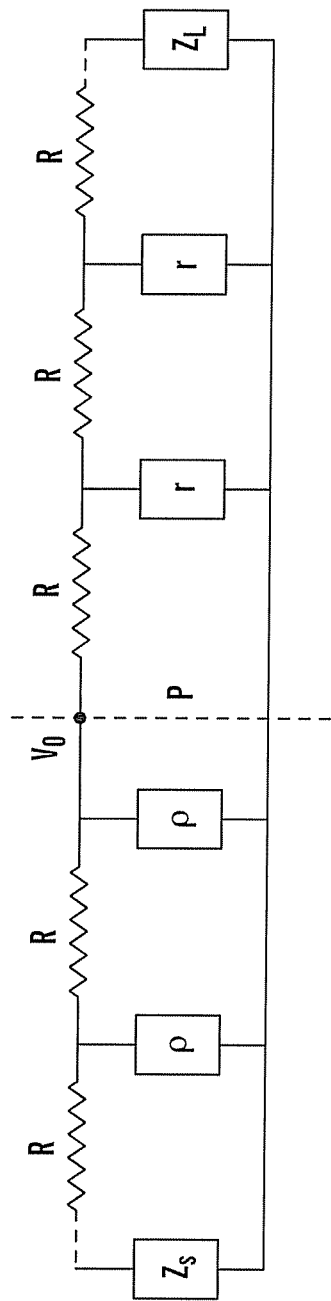
FIGS. 6($a$) through 6($e$) a schematic diagrams modeling the circuit behavior of the cascade configuration of FIG. 5.
Figure 6B:
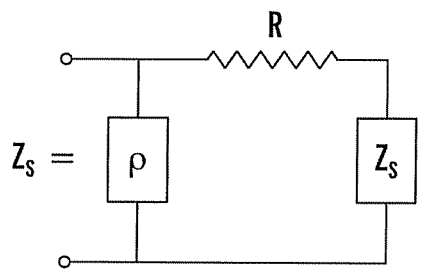
Figure 6C:
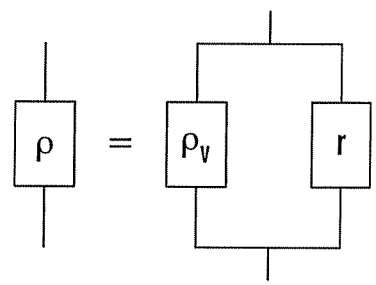
Figure 6D:
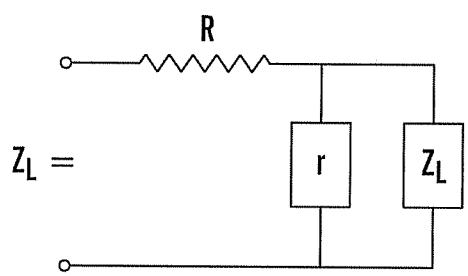
Figure 6E:
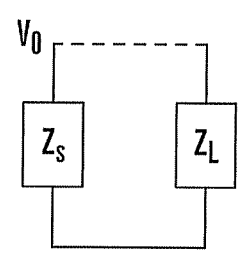

For the RESET process, the section of the circuit to the left of P FIG. 6(a) is ON, while the section of the circuit to the right of P is OFF. Hence, the representation is the physical reverse of that shown in FIG. 6(a) (including the terminating impedances as well). The difference from the SET process is that the current through the via itself also contributes to the heating. From FIGS. 6(b) and 6(c), the via current $I_V$ is given by $$I_V = \frac{(R+Z_S)r}{(R+Z_S)r + (R+Z_S+r)\rho_V} I.$$

The internal heating power $W_{int} = I_V^2 \rho_V$ is 0.15 mW, so the total power $W+W_{int}=0.76$ mW. This power is reasonable level for RESET.

The SET process is self-timed, in that the stage delay depends on the rates of heat flow and recrystallization within the via. In an exemplary embodiment, the RESET process is timing controlled as described above. At a certain point in the melt process of a via, the load clock signal is turned off, so as to allow the amorphization process to stabilize. Once the via is amorphized, the clock signal is restored, allowing the melt process to initiate in the next via in the sequence. Alternatively, if the melt has considerably higher resistance than the crystalline phase at the same temperature, then melting of the via will itself turn off its associated heater. In this alternative mode of operation, the RESET cascade would not require clock intervention but would still be self-timed. It should further be noted that it is possible to initiate the cascade from either end of the via chain, for both SET and RESET operations, and that the SET and RESET operations can themselves be initiated from opposite ends.

For purposes of illustration, the above described analysis was performed considering uniform, resistive loads for each cascade stage. However, it is also possible to accommodate systems with non-uniform loads by varying the number of vias per load, or by tuning the geometries of the loads and heating elements. Dynamic loads, when filtered using bypass capacitors (as is typical in integrated circuits), can also be used. In the following description, a formal generalization of the cascade with uniform loads is considered, which enables non-uniform loads to be handled.

General Self-Similar Cascade

Figure 7A:
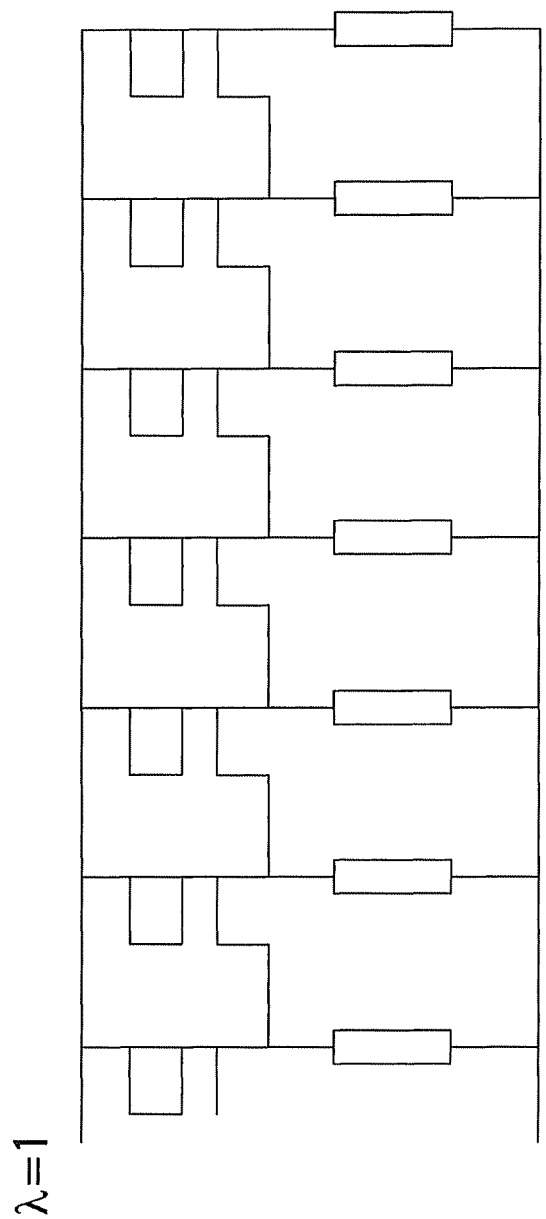

A more general type of cascade than that where all stages are identical is possible, in which the stages are self-similar, obeying a scaling law:

$$R_n = \lambda^n,$$

where $\lambda$ is a constant, and $R_n$ is any resistance (e.g., heater, load, PCM) associated with stage n. The case of identical stages now appears as the special case $\lambda=1$, as shown in FIG. 7(a). By way of comparison, FIG. 7(b) illustrates the case. $\lambda=2$. Here, the electrical resistances of the stages are varied by a factor of 2 per stage by use of parallel connections. Each stage represents a fan-out of 2. The circuit of FIG. 7(b) could, for example, power gate four independent loads, two loads of resistance r, one of resistance r/2, and one of r/3, demonstrating greater flexibility regarding load impedances than the $\lambda=1$ cascade. A case $\lambda=1/\sqrt{2}$ is also realizable by using two kinds of PCM vias and loads, differing by a factor of square root of 2 in resistance, plus the parallel technique of FIG. 7(b).

To briefly summarize the properties of the self-similar type, the non-unity $\lambda$ cascade confers additional flexibility, and operates much faster for a large number of loads than a $\lambda=1$ cascade (for $\lambda=\frac{1}{2}$, N stages drives $2^N-1$ loads, so that time is logarithmic with the driven power, instead of linear with power as for $\lambda=1$). On the other hand, the ability of internal heating to assist the RESET/SET power ratio is reduced (the ratio can however also be achieved by manipulating the clock controls), and the possible problem of a partial SET effect from heater currents flowing through already OFF vias during RESET is augmented.

Via Design

The PCM vias utilized in the cascade switch design are three terminal devices, in contrast to the two terminal devices conventionally used in PCM memory application. In the notation of FIGS. 4(a) and 4(b), the switch includes a heater terminal h, a PCM terminal p, and a common terminal c. Again, in the cascade circuit of FIG. 5, p is connected to the supply, c is connected to the load, and h is the control terminal. Although the PCM switch a three terminal device, the control terminal h bears very little similarity to the gate/base terminals in FET/bipolar transistors, for example.

Figure 8:
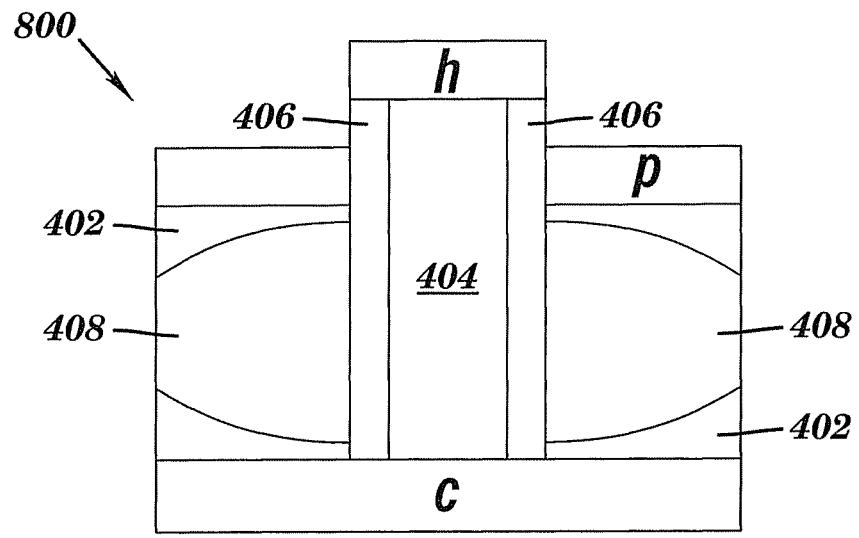
FIGS. 8 and 9 are alternative embodiments of the three-terminal PCM switch of FIG. 4.
Figure 9:
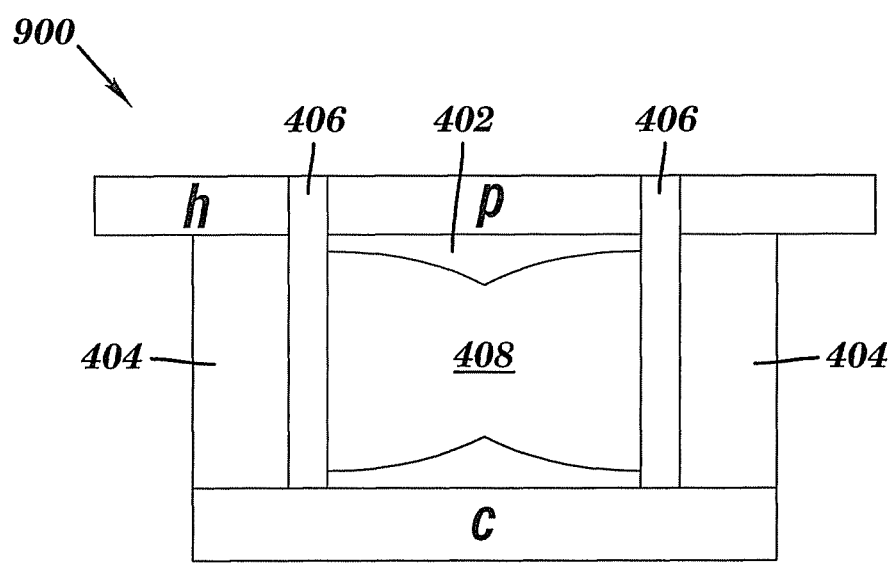

Additional exemplary designs for the PCM switch vias are presented in FIGS. 8 and 9. As opposed to a "planar" heater configuration shown in FIG. 4(a), FIG. 8 illustrates a post-type heater configuration 800 in which the heater 404 passes vertically through the PCM 402, electrically isolated from the PCM 402 and the "p" terminal through a surrounding insulating layer 406. In configuration 900 of FIG. 9, the heater 404 is still of a vertical configuration, but instead surrounds the PCM material 402, separated by the insulating layer 406.

Suitable PCM dimensions may be on the order of about 0.1 μm, with an exemplary heater thickness of about 20 nm, and an oxide thickness of about 5 nm. In the embodiment of FIG. 9, the heater post diameter may be about 0.05 μm. A suitable heater material includes a refractory metal such as TaSiN, for example, that is stable at temperatures up to about 1000° C.), which can be made with an appropriate resistivity (between metallic and a degenerate semiconductor), and which is also a poor thermal conductor. A suitable insulating oxide material includes $SiO_2$. A material with metallic resistivity, but a sub-metallic thermal conductivity, such as TiN, is suitable for the contacts. In addition surrounding the device with an insulator having a very poor thermal conductivity, such as N-block ($Si_{50} C_{25}H_{50}N_{50}$) for example, rather than $SiO_2$, is desirable.

Thus described, the PCM cascade switch may be used in several different ways. As illustrated above, an exemplary embodiment utilizes a set of cascaded switches to gate the power to a block of logic circuits, which includes logic gates, data latches and related circuitry that are grouped in a way so as to perform a particular logic function. The logic block may include any number of logic gates, but typically will contain more than ten. The logic block will then be "partitioned" in such a way that each partition contains an appropriate number of circuits such that these circuits may be sufficiently powered from one cascade switch element. The power connection from each partition is connected to the load terminal of a single cascade switch element. In the case of the λ=1 cascade, the number of elements in a partition will generally be uniform such that each cascade switch has roughly the same load impedance.

In CMOS circuits, where current drawn from the power node is low except when the circuitry is switching, logic block partitions may be "clocked" in order to trigger a low impedance to their power node, which acts as a load to the cascade switch element, which can then be used to cause it to change state (depending upon the state of the other switches in the chain). Furthermore, the cascade switches from one logic block could be serially chained to the cascade switches from other logic blocks resulting in a technique for providing a power gating domain of arbitrary size.

More extensive control of the SET and RESET programming phases by control of clock and input signals to the logic sub-blocks may be desired. For example, the selection of a lower clocking frequency during SET could be a means for obtaining a reduction in heater power for SET relative to RESET. Control of terminating impedances at right hand side of the cascade in SET and RESET modes is also desirable. In order to facilitate RESET at minimal input heater power, the PCM used for the vias should have a low maximum crystallization front velocity (e.g., 1 m/s or more).

Finally, two figures of merit (FM) emerge from the foregoing discussion with respect to the large load resistance r limit. A via-level FM is the ratio of heater power achievable during switching to the heat dissipated in the via during the ON phase. This is approximately $r/\rho_V$, and is typically large and under circuit design control (i.e., not just a function of via materials and design).

A circuit level FM is the current output, $NV_0/r$, divided by the current requirement of the initialization line, i.e., one heater current which, again in the large-r limit, is $V_0/\sqrt{Rr}$. The ratio of these is $N/\sqrt{r/R}$, again in the large-r limit, is about I=2.5 mA. This is to be compared with $NV_0/r=N$ mA, which is again typically large and under circuit-design control (the logic sub-blocks need not be too small, in order to enable bundling into approximately equivalent-power sub-blocks, while the larger N is the larger gain).

For a simple PCM device such as a 2-terminal PRAM element, these figures of merit are of order unity and are only a function of via materials and design. The cascade circuit enables circuit control of both FM's, so that a PCM-based power gating switch (much more compact than a pure FET design) is theoretically possible.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A three-terminal switching device for use in integrated circuit devices, comprising:

a phase change material (PCM) disposed in contact between a first terminal and a second terminal;

a heating device disposed in direct electrical contact between said second terminal and a third terminal, said heating device positioned proximate said PCM, and configured to switch the conductivity of a transformable portion of said PCM between a lower resistance crystalline state and a higher resistance amorphous state; and an insulating layer configured to electrically isolate said heater from said PCM material, and said heater from said first terminal, wherein said PCM, said heater and said insulating layer are formed atop said second terminal; said insulating layer surrounds said PCM and said heater surrounds said insulating layer; said first terminal is formed atop said PCM and adjacent said insulating layer; and said third terminal is formed atop said heater and adjacent said insulating layer.

2. The switching device of claim 1, wherein said PCM further comprises an alloy of: $Ge_xSb_yTe_z$.

3. A switching circuit configured for controlling static power consumption in integrated circuits, comprising:

a plurality of three-terminal, phase change material (PCM) switching devices connected between a voltage supply terminal and a corresponding sub-block of integrated circuit logic;

each of said PCM switching devices further comprising a phase change material (PCM) disposed in contact between a first terminal and a second terminal; a heating device disposed in contact between said second terminal and a third terminal, said heating device positioned proximate said PCM, and configured to switch the conductivity of a transformable portion of said PCM between a lower resistance crystalline state and a higher resistance amorphous state; and an insulating layer configured to electrically isolate said heater from said PCM material, and said heater from said first terminal;

wherein the third terminal of a first of the PCM switching devices is coupled to a set/reset switch, and wherein the third terminal of the remaining PCM switching devices is coupled to the second terminal of an adjacent PCM switching device in a cascade configuration, and wherein said PCM, said heater and said insulating layer are formed atop said second terminal; said insulating layer surrounds said PCM and said heater surrounds said insulating layer; said first terminal is formed atop said PCM and adjacent said insulating layer; and said third terminal is formed atop said heater and adjacent said insulating layer.

4. The switching circuit of claim 3, wherein said set/reset switch, when configured in a set position, is configured to cause each of the PCM switching devices to change from an amorphous state to an crystalline state by a cascading sequence of currents passed through the heating devices of the PCM switching devices.

5. The switching circuit of claim 3, wherein said set/reset switch, when toggled between a reset position and an open position in conjunction with a clock signal applied to said sub-blocks of integrated circuit logic, is configured to cause each of the PCM switching devices to change from a crystalline state to an amorphous state by a cascading sequence of melt current and quench events applied to the heating devices of the PCM switching devices.

6. The switching circuit of claim 3, wherein said PCM further comprises an alloy of: $Ge_xSb_yTe_z$.

* * * * *